United States Patent
Wan et al.

(10) Patent No.: US 6,265,939 B1
(45) Date of Patent: Jul. 24, 2001

(54) LINEAR POWER DETECTORS AND METHODS FOR POWER AMPLIFIERS

(75) Inventors: Arthur James Wan; Anthony N. Kurlovich, both of Carlsbad; Paul DeSize, Wildomar; Shawn Scott Smith, Escondido, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/535,147

(22) Filed: Mar. 24, 2000

(51) Int. Cl.[7] ............................. H03G 3/20; H03G 3/10
(52) U.S. Cl. ......................... 330/140; 330/279; 330/281
(58) Field of Search ................................. 330/140, 141, 330/279, 281

(56) References Cited

U.S. PATENT DOCUMENTS

| 3,166,720 | 1/1965 | Rosen et al. . |
| 3,320,532 | 5/1967 | Watters . |
| 4,086,432 | 4/1978 | Jones . |
| 4,317,083 | 2/1982 | Boyd . |
| 4,318,053 | * 3/1982 | Sondermeyer ........................ 330/281 |
| 4,350,959 | 9/1982 | Rosenbaum . |
| 5,410,271 | 4/1995 | Arbel . |
| 5,640,128 | 6/1997 | Wilhelm . |
| 5,646,573 | 7/1997 | Bayruns et al. . |

* cited by examiner

Primary Examiner—Robert Pascal
Assistant Examiner—Patricia T. Nguyen
(74) Attorney, Agent, or Firm—Blakely, Sokoloff, Taylor & Zafman LLP

(57) ABSTRACT

RF power detectors having a linear variation in differential output with the output power in dBm of a power amplifier. The detectors include a rectifying diode sensing the peak RF signal coupled thereto. Additional circuitry adds additional incremental loads to the detector output at various increased power amplifier outputs to maintain a substantially linear variation in detector output with the output power in dBm of the power amplifier. The second output of the differential output of the detector is referenced to the same number of forward conduction diode voltage drops as the output from the rectifying diode, so that the differential output of the detector is substantially temperature independent A resonant circuit may be used to enhance the sensitivity of the detector circuit.

18 Claims, 1 Drawing Sheet

LINEAR POWER DETECTORS AND METHODS FOR POWER AMPLIFIERS

BACKGROUND OF THE INVENTION

1. Field of the Invention

The present invention relates to the field of gain control circuits for power amplifiers.

2. Prior Art

In certain applications, power amplifiers are provided with a gain control capability so that the output of the power amplifier may be automatically controlled or changed as desired. By way of example, in wireless RF telephone devices such as in cellular systems, the broadcast power of the mobile unit is controlled by the base station to provide an adequate, but not excessive, received signal strength at the base station for recovery of the information in the received signal. Accordingly, in the mobile unit, the gain of the RF power amplifier is controlled by a gain control feedback loop holding the power output of the power amplifier to the power level commanded by a signal received from the base station. In such gain control feedback loops, it is normally desired to provide a feedback signal which is linear with the power output in dBm of the power amplifier. This aids in maintaining a constant bandwidth of the gain control loop, making the loop easier to stabilize and in providing a uniform response throughout its operating range, and in providing a more accurate response to a commanded change in power amplifier output received from the base station.

In a typical wireless device, the RF output of the power amplifier is capacitively coupled to a detector circuit which is intended to detect power level in the RF signal and to provide an appropriate gain control feedback signal in response thereto. The typical prior art detector utilizes a diode circuit to provide a peak detector on the RF signal, utilizing the non-linear characteristics of the diode to obtain the detector response. That response, however, while approximating a response linear in dBm with power amplifier output for the lower power outputs of the power amplifier, curves upward at the higher power amplifier outputs to grossly deviate from the desired linear characteristic. This is illustrated in the upper curve in FIG. 1. As a result, either analog or digital compensation techniques for this effect must be included in the circuitry, or alternatively, compromises in stability and accuracy of commanded gain changes must be tolerated. Further, diodes as used for peak detection are temperature sensitive, and the low battery voltages now commonly being used severely limit the headroom of the detector circuit, further limiting the performance of typical prior art detectors.

BRIEF SUMMARY OF THE INVENTION

RF power detectors having a linear variation in differential output with the output power in dBm of a power amplifier. The detectors include a rectifying diode sensing the peak RF signal coupled thereto. Additional circuitry adds additional incremental loads to the detector output at various increased power amplifier outputs to maintain a substantially linear variation in detector output with the output power in dBm of the power amplifier. The second output of the differential output of the detector is referenced to the same number of forward conduction diode voltage drops as the output from the rectifying diode, so that the differential output of the detector is substantially temperature independent. A resonant circuit may be used to enhance the sensitivity of the detector circuit.

DETAILED DESCRIPTION OF THE PREFERRED EMBODIMENT

Figure 2:
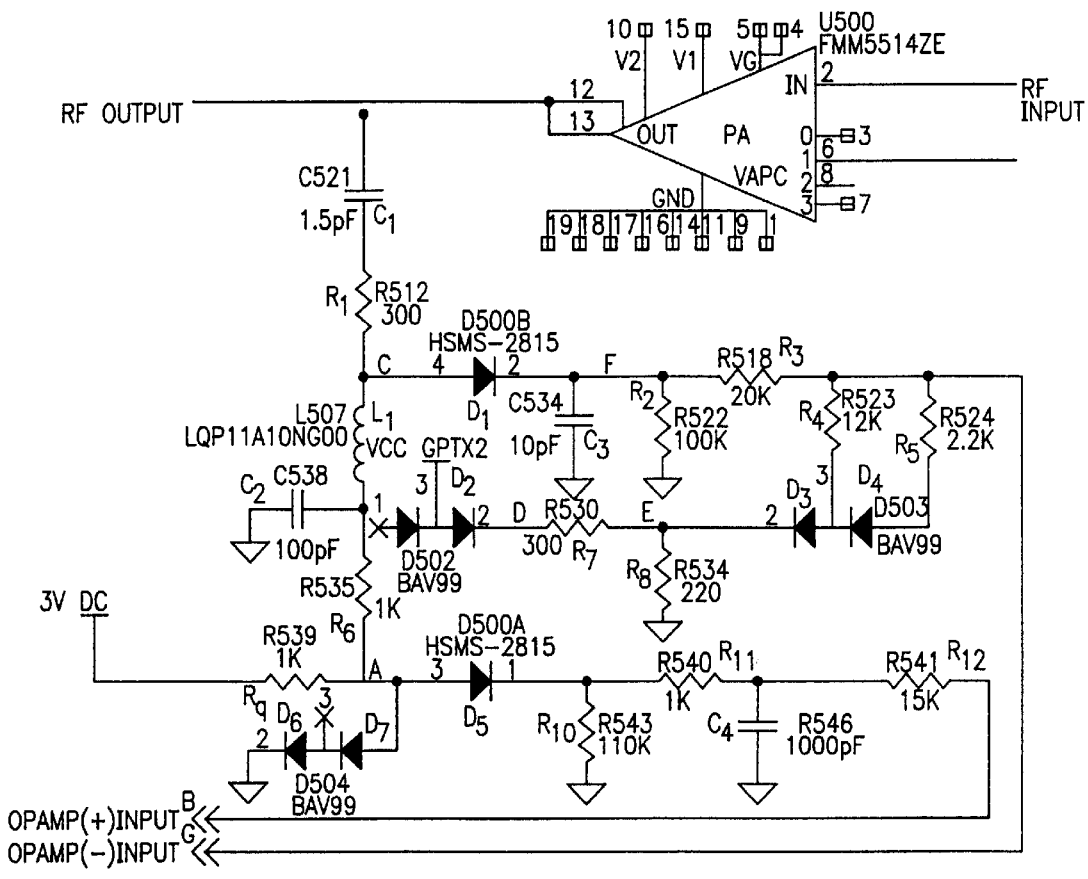
FIG. 2 is a circuit diagram for the power amplifier output detector of a preferred embodiment of the present invention.

Now referring to FIG. 2, a circuit diagram for the power amplifier output detector of the preferred embodiment, as coupled to a power amplifier, may be seen. As shown in this Figure, resistor $R_9$ is coupled between a DC power supply, in one embodiment a 3 volt DC supply, and through diodes $D_6$ and $D_7$ to ground, setting the voltage at node A at two forward conduction diode voltage drops above ground. The DC voltage on node A sets the DC voltage for resistor $R_6$, inductor $L_1$, resistor $R_1$ and one side of capacitor $C_1$, capacitor $C_1$ coupling the output of the power amplifier PA to the detector circuit and capacitor $C_2$ providing an RE bypass. Resistor $R_{10}$, a relatively large resistor in comparison to resistor $R_9$, sets a conduction current through diode $D_5$, with resistor $R_{11}$ and capacitor $C_4$ providing a low pass filter on the voltage across resistor $R_{10}$. Resistor $R_{12}$ sets the output impedance for that voltage. Thus, the voltage on node B, one of the differential outputs of the detector circuit, will be substantially equal to one diode voltage drop below the voltage on node A, or one diode voltage drop above ground, as node A itself is two diode voltage drops above ground.

The RF output of the power amplifier PA is coupled through capacitor $C_1$ to resistor $R_1$. The combination of inductor $L_1$, diode $D_1$ and capacitor $C_3$ provides a resonant circuit at the RF frequencies of interest to provide a greater amplitude for the RF signal on node C. Resistor $R_1$ controls the amount of resonant peaking so that the RF voltage on node C will be relatively flat over the RF frequencies throughout the power amplifier normal broadcast frequency range. Diode $D_1$ rectifies the peak RF voltage appearing on node C to charge capacitor $C_3$ to that peak voltage, resistor $R_2$, a relatively large resistor in comparison to resistors $R_1$ and $R_6$, establishing a minimum average forward conduction current through diode $D_1$ to better define the forward conduction diode voltage drop across the diode.

Diode $D_2$ is coupled between the positive power supply, in one embodiment approximately 3 volts, through resistors $R_7$ and $R_8$ to ground. In this exemplary embodiment, the voltage on node D will be approximately 2.3 volts, with resistors $R_7$ and $R_8$ dividing that voltage to approximately 40% of its value, or slightly less than one volt. In that regard, resistors $R_7$ and $R_8$ are relatively low valued resistors in comparison to resistors $R_3$, $R_4$ and $R_5$, so that the voltage on node E is relatively insensitive to any reasonable currents through diodes $D_3$ and $D_4$.

To explain the operation of the circuit, assume first that there is no RF output of the amplifier PA. The DC voltage level on node A, namely two diode voltage drops above ground, also establishes the voltage on node C. The voltage on node F will be one diode voltage drop (diode $D_1$) below the voltage on node C, and thus the voltage on node F is one diode voltage drop above ground. Since the voltage on node E is above ground, both diodes $D_3$ and $D_4$ will be inadequately forward biased to conduct. Accordingly, the voltage on node G, one of the differential outputs of the circuit, will be equal to the voltage on node F, namely one diode voltage drop above ground, as is the voltage on node B, the other differential output of the circuit. Accordingly, when there is no RF output of the power amplifier PA, the differential output between nodes B and G will be zero, independent of temperature, although there will be a common mode variation in the differential output with temperature corresponding to the characteristic variation in the forward conduction voltage drop of a silicon rectifier.

For low RF power output of the power amplifier PA, the RF voltage level will be sensed at node C and rectified by diode $D_1$ to increase the voltage on node F responsive to that RF signal level. For low RF power levels, the voltage at node F will be less than one forward conduction diode voltage drop higher than the voltage at node E, so that diodes $D_3$ and $D_4$ will remain non-conducting. Accordingly, the DC voltage on node F will respond to the variations in the RF signal level on node C in accordance with the forward conduction characteristics of diode $D_1$. At these lower power amplifier outputs, the voltage on node F will increase approximately linearly with increases in the output power, in dBm, of the power amplifier.

At higher power amplifier output levels, the DC voltage on node F will increase faster than desired, namely, will increase faster than a linear relationship between the voltage on node F and the output power in dBm that the power amplifier would predict.

To counteract this effect, the voltage on node E is set as described, so that diode $D_3$ begins to conduct approximately at the voltage where the voltage on node F begins to deviate from the desired linear relationship. Now, resistor $R_4$ and diode $D_3$ begin to conduct with increasing amplifier power output, providing an incremental load on resistor $R_3$. Now the voltage at node G, while continuing to rise with increases in the output power of the power amplifier, rises slower than the voltage on node F. By appropriate selection of resistors $R_3$ and $R_4$, as well as appropriate selection of the components establishing the voltage at node E, the voltage increase at node C with increases in the output power of the power amplifier in dBm may be held to still closely approximate a linear relationship.

Figure 1:
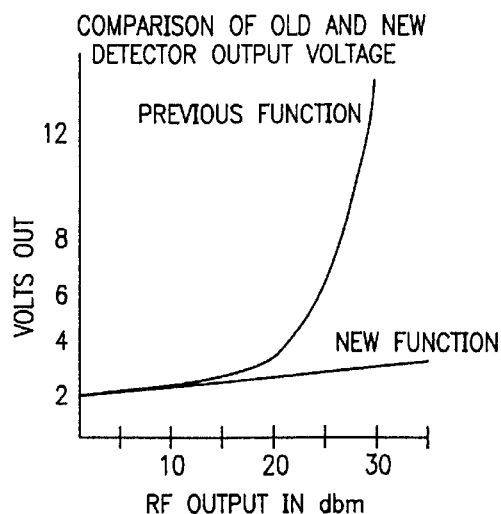
FIG. 1 illustrates the variation in detector output with power amplifier output of typical prior art detectors and detectors in accordance with the preferred embodiment of the present intention.

At still higher power amplifier outputs, the voltage at node F will rise even faster than before. To counteract this further increase so as to maintain a substantially linear variation in the voltage at node G with the output of the power amplifier PA in dBm, diode $D_4$ will begin to conduct, putting the further incremental load of resistor $R_5$ on the output of the circuit. This maintains the linear relationship in the voltage at node G with the power output in dBm of the power amplifier, in spite of the much more rapidly increasing voltage at node F. Accordingly, while the output of prior detectors, and for that matter the voltage at node F, may be illustrated by the upper curve of FIG. 1, the output of the circuit at node G may be illustrated by the lower curve of FIG. 1.

As may be seen in FIG. 2, the output of the detector circuit is a differential voltage that is substantially temperature insensitive and that is substantially linear with the power output in dBm of the power amplifier. That differential voltage may easily be converted to a single ended voltage or current with the use of a differential input, feedback amplifier, to provide a single-ended drive to the gain control input of a power amplifier. Since the conversion of the differential detector signal to a single-ended signal, and any other functions which may be provided by such an amplifier, are not part of the present invention, exemplary embodiments thereof will not be described in greater detail herein.

Having described the circuit of FIG. 2 and its operation in detail, various functional aspects of the exemplary circuit disclosed should become apparent. By way of example, the voltage drop across diodes $D_6$ and $D_7$ establishes a DC voltage on node A, and thus, a DC voltage on node C, to cause forward conduction through diode $D_1$, even for no RF signal output for the power amplifier PA. Diode $D_5$ is substantially identical to diode $D_1$, ideally on the same die, with resistor $R_{10}$ being approximately equal to resistor $R_2$, so that the DC forward conduction voltage drop across diode $D_1$ is essentially replicated by diode $D_5$, the forward conduction diode voltage drops of the two diodes $D_1$ and $D_5$ canceling each other throughout the operating temperature range. Therefore the differential output of the circuit is substantially zero throughout the temperature range when the power output of the power amplifier is substantially zero. Inductor $L_1$, diode $D_1$ and capacitor $C_3$ form a resonant circuit to enhance the RF signal coupled from the power amplifier by the coupling capacitor $C_1$, though with the peaking of the resonant circuit being limited primarily by resistor $R_1$ so that the response of the resonant circuit is adequately flat throughout the operating frequency range of the power amplifier. Resistors $R_4$ and $R_5$, together with diodes $D_3$ and $D_4$, provide for the phasing in of additional loads on the output of the detector output with increasing outputs of the power amplifier to prevent what otherwise would be an undesired curving upward of the detector output with power output of the power amplifier. In the embodiment shown, diode $D_3$ and resistor $R_4$ provide for the phasing in of one incremental load on the output for increasing power outputs of the power amplifier, with diode $D_4$ and resistor $R_5$ providing for a second phasing in of an additional incremental load on the detector output at still higher power amplifier outputs. In that regard, resistors $R_4$ and $R_5$, being selected in relation to resistor $R_3$ to linearize the output as desired, typically result in resistor $R_5$ being a substantially lower valued resistor than resistor $R_4$. Also note that diodes $D_3$ and $D_4$ are serially referenced to the voltage at node E. In alternate embodiments, instead of a single voltage at node E, a plurality of different such voltages could be generated, with diodes $D_3$ and $D_4$ referenced to different ones of these voltages. Similarly, for greater range or still further improved linearity, additional incremental loads through additional diodes and resistors might be incorporated, either referenced to the voltage at node E as in FIG. 2, or in alternate embodiments, referenced to different voltages as may be generated, by way of example, in a manner similar to the generation of the voltage at node E.

The net result, in any event, is a differential detector output that is substantially linear with the power output in dBm of the power amplifier. While various embodiments have been disclosed and described herein, it will be understood by those skilled in the art that various changes in form and detail may be made therein without departing from the spirit and scope of the invention.

What is claimed is:

1. A power detector comprising:
   a first circuit having an input for capacitively coupling output of an amplifier to the input of the first circuit, the first circuit having a first diode coupling peaks of a signal capacitively coupled thereto to a first power detector output;
   a second circuit having an input DC coupled to the input of the first circuit, the second circuit being coupled to provide a second power detector output, the second circuit including a second diode biased to forward conduction between the input to the second circuit and the second power detector output,
   difference between the first power detector output and the second power detector output being a measure of output power of the amplifier; and a third circuit coupled to the first power detector output and providing an incremental load on the first power detector output for amplifier power outputs above a predetermined power output.

2. The power detector of claim 1 further comprises a plurality of additional circuits coupled to the first power detector output, each providing an incremental load on the first power detector output for amplifier power outputs above a respective predetermined power output.

3. The power detector of claim 2 wherein the respective predetermined power outputs are different power outputs.

4. The power detector of claim 1 further comprises a resonant circuit coupled to the input of the first circuit, the resonant circuit enhancing the signal capacitively coupled from the amplifier output.

5. The power detector of claim 1 wherein the first and second circuits are DC coupled to circuit ground through a forward conducting circuit element.

6. The power detector of claim 5 wherein the forward conducting circuit element comprises two diodes coupled in series.

7. A power detector comprising:
    a series connection of a first resistor and a first diode coupling peaks of a signal coupled to an input thereto to a first power detector output;
    a series connection of a first capacitor and a second resistor coupled between an output of an amplifier and the input to the series connection of the first capacitor and the final resistor;
    an inductor coupled to the input to the series connection of the first resistor and the first diode;
    a second capacitor coupled between the inductor and circuit ground;
    a second diode biased to forward conduction and coupled between input to the second diode and a second power detector output;
    a resistor coupled between the junction between the inductor and the second capacitor, and the input to the second diode,
    difference between the first power detector output and the second power detector output being a measure of output power of the amplifier; and
    a circuit coupled to the first power detector output and providing an incremental load on the first power detector output for amplifier power outputs above a predetermined power output.

8. The power detector of claim 7 further comprises a plurality of additional circuits coupled to the first power detector output, each providing an incremental load on the first power detector output for amplifier power outputs above a respective predetermined power output.

9. The power detector of claim 8 wherein the respective predetermined power outputs are different power outputs.

10. The power detector of claim 7 wherein the input to the second diode is coupled to circuit ground through a forward conducting circuit element.

11. The power detector of claim 10 wherein the forward conducting circuit element comprises two diodes coupled in series.

12. The power detector of claim 1 wherein the signal is an RF signal.

13. A nethod comprising:
    coupling output of an amplifier to an inductor and a capacitor forming a resonant circuit;
    detecting peaks of a voltage on the resonant circuit by a first diode to provide a first detector output;
    providing an incremental load on the first detector output for amplifier outputs above a predetermined output; and
    DC coupling a second diode to the first diode to provide a second detector output, difference between the first detector output and the second detector output being a measure of output power of the amplifier.

14. The method of claim 13 wherein the peaks are detected by a series combination of the first diode and a resistor, and further comprising providing a plurality of incremental loads on the first detector output, each for amplifier outputs above a respective predetermined output.

15. The method of claim 14 wherein the respective predetermined amplifier outputs are different amplifier outputs.

16. The method of claim 13 wherein the DC coupling between the first and second diodes is coupled to circuit ground through a forward conducting circuit element.

17. The method of claim 16 wherein the forward conducting circuit element comprises two diodes coupled in series.

18. The method of claim 13 wherein the voltage corresponds to an RF signal.

\* \* \* \* \*